United States Patent [19]

Koch et al.

[11] Patent Number: 4,944,838

[45] Date of Patent: Jul. 31, 1990

[54] METHOD OF MAKING TAPERED SEMICONDUCTOR WAVEGUIDES

[75] Inventors: Thomas L. Koch, Holmdel; Uziel Koren, Fair Haven, both of N.J.

[73] Assignee: AT&T Bell Laboratories, Murray Hill, N.J.

[21] Appl. No.: 389,074

[22] Filed: Aug. 3, 1989

[51] Int. Cl.$^5$ ............... H01L 21/306; B44C 1/22; C03C 15/00; C03C 25/06
[52] U.S. Cl. .................... 156/652; 156/655; 156/659.1; 156/662; 350/96.12; 357/16; 437/126; 437/725
[58] Field of Search ............... 156/647, 649, 650, 652, 156/655, 659.1, 662; 357/16, 30; 350/96.1, 96.11, 96.12; 372/48, 50; 437/126, 129, 225, 234

[56] References Cited

U.S. PATENT DOCUMENTS

| | | | |
|---|---|---|---|
| 3,978,426 | 8/1976 | Logan et al. | 357/16 X |
| 3,993,963 | 11/1976 | Logan et al. | 357/16 X |
| 4,354,898 | 10/1982 | Coldren et al. | 156/647 |
| 4,622,674 | 11/1986 | Mito | 372/45 |
| 4,656,636 | 4/1987 | Amann et al. | 372/50 |
| 4,662,988 | 5/1987 | Renner | 156/649 X |

OTHER PUBLICATIONS

Tien et al., Applied Optics, vol. 12, No. 8, Aug. 1973, "Formation of Light-Guiding Interconnection . . . ", pp. 1909-1916.
Merz et al., Appl. Phys. Lett., vol. 26, No. 6, Mar. 15, 1979, "Taper Couplers for GaAs-Al$_x$Ga$_{1-x}$As Waveguide Layers . . . ", pp. 337-341.
Milton et al., IEEE J. of Quan. Elec., vol. QE-13, No. 10, Oct. 1977, "Mode Coupling in Optical Waveguide Horns", pp. 828-835.
Elliott et al., IEE Colloquim on Towards Semiconductor Integ. Optoele., Dig. No. 29, Nov. 1-4, 1985, "Photoelectrochemical Etching of . . . ", pp. 11/1-11/4.
Cox et al., J. of Lightwave Tech., vol. 6, No. 6, Jun. 1988, "Development of Tapered Glass Coupling . . . ", pp. 1045-1050.

Primary Examiner—William A. Powell
Attorney, Agent, or Firm—Gregory C. Ranieri

[57] ABSTRACT

Adiabatic mode control and structural reproducibility are achieved by a tapered semiconductor waveguide structure wherein semiconductor guiding layers are interleaved with stop-etch layers and each guiding layer extends further along the propagation axis of the waveguide further than the guiding layer immediately adjacent thereabove to create a staircase-like core or guiding structure. Cladding regions of appropriate semiconductor material having a lower index of refraction than the tapered core structure may be added to completely surround the tapered guiding structure. The profile of the tapered structure is realizable as any desired staircase-like shape such as linear, parabolic, exponential or the like. Additional layers of higher index of refraction semiconductor material may be included in the cladding region to permit additional beam shaping of the expanded spatial mode propagating along the tapered waveguide.

Photolithographic masks defining successively larger exposed areas are aligned, deposited over the waveguide structure, and then removed following each etching step. Material selective etching techniques are employed to remove exposed (unmasked) portions of guiding layers. In sequence, the exposed, formerly underlying portions of the stop-etch layers are then removed using material selective etching. Iteration of the above process steps permits a tapered waveguide structure to be defined.

9 Claims, 4 Drawing Sheets

PROPAGATION AXIS

METHOD OF MAKING TAPERED SEMICONDUCTOR WAVEGUIDES

CROSS-REFERENCE TO RELATED APPLICATION

This application is related to U.S. patent application Ser. No. 389,087 filed on even date herewith.

TECHNICAL FIELD

This invention is related to semiconductor devices and, more particularly, to devices incorporating optical waveguide structures.

BACKGROUND OF THE INVENTION

Efficient transfer of lightwave signals from one waveguide to another is important to the development of optical systems and circuits. Lightwave communication systems require communication, at a minimum, between the transport medium such as optical fiber and waveguide devices such as lasers, couplers, switches and detectors. By comparison, propagating modes of the lightwave signals in the transport medium are significantly larger than in the waveguide devices. For example, signal mode optical fibers propagate lightwave signals having a fundamental mode of approximately 6–10 $\mu m$ width whereas waveguide devices such as single frequency semiconductor lasers support lightwave signals having a fundamental mode width less than approximately 1 $\mu m$.

Tapers have been developed to control the mode size of the guided lightwave signals and, thereby, provide efficient coupling between optical waveguide devices and optical fibers. Tapers have been realized in two forms: a fiber taper which, as the name suggests, is based solely in the optical fiber and a tapered waveguide which is based solely in the device structure. In both forms, the taper increases or decreases along the direction of propagation for the lightwave signals.

Tapered waveguides, whether based in semiconductor material or electrooptic material, have been formed by epitaxial growth techniques or by special etching techniques such as photoelectrochemical etching or selective chemical etching. In addition, tapers have been formed in either the horizontal or the vertical direction, transverse to the propagation direction. For example, see *Appl. Phys. Lett.*, 26 (6), pp. 337–40 (1975), U.S. Pat. No. 3,993,963, and U.S. Pat. No. 3,978,426. While individual attempts to create tapered waveguides have succeeded, it has been found that the techniques employed lack sufficient controllability for making identically reproducible tapered waveguides from one device to the next.

SUMMARY OF THE INVENTION

Adiabatic mode control and a high degree of structural reproducibility are afforded by a tapered semiconductor waveguide structure wherein individual semiconductor guiding layers are interleaved with corresponding individual stop-etch layers and each successive guiding layer extends further along the propagation axis of the waveguide than the guiding layer immediately adjacent thereabove to create a staircase-like core or guiding structure. Cladding regions of appropriate semiconductor material having a lower index of refraction than the tapered structure may be added to completely surround the tapered structure. The profile of the tapered guiding structure is realizable as any desired shape such as linear, parabolic, exponential or the like.

In another embodiment, additional layers of higher index of refraction semiconductor material may be included in the cladding region to permit additional beam shaping of the expanded spatial mode propagating along the tapered waveguide.

In additional embodiments, the tapered semiconductor waveguide is included as an intra-cavity element for semiconductor lasers to provide beam expansion at an end facet, for example.

Photolithographic masks defining successively larger exposed areas are aligned, deposited over the waveguide structure, and then removed following each etching step. Material selective etching techniques are employed to remove exposed (unmasked) portions of guiding layers. In sequence, the exposed, formerly underlying portions of the stop-etch layers are then removed using material selective etching. Iteration of the above process steps permits a tapered waveguide structure to be defined.

BRIEF DESCRIPTION OF THE DRAWING

A more complete understanding of the invention may be obtained by reading the following description of specific illustrative embodiments of the invention in conjunction with the appended drawing in which.

Figure 1:
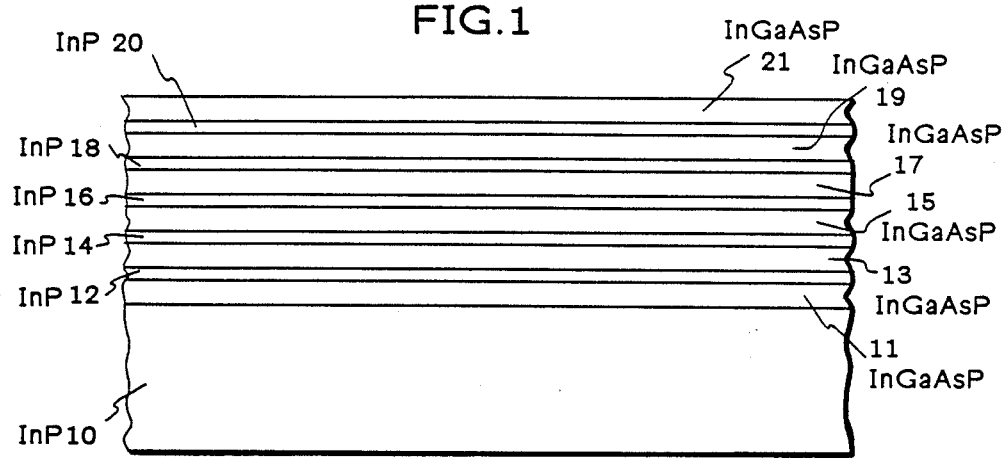
FIGS. 1 through 4 show successive processing steps for making a tapered semiconductor waveguide (shown in cross-sectioned view) in accordance with the principles of the invention.

It should be noted that the elements and embodiments shown in the various FIGS. have not been drawn to scale. They are merely illustrative of aspects of the present invention. As a result, the drawing is intended to be construed for purposes of explication and not for the purpose of limitation.

DETAILED DESCRIPTION

The semiconductor heterostructure shown in FIG. 1 may be fabricated by standard epitaxial processing techniques such as molecular beam epitaxy, vapor phase epitaxy, and metal organic chemical vapor deposition. Fabrication techniques including semiconductor layer growth, impurity doping, photolithography and any contact metallization to realize exemplary devices shown in FIGS. 4 and 5, in accordance with the principles of the invention described above, are believed to be well known to those persons of ordinary skill in the art. For a complete overview and discussion of the techniques, see *AT&T Technical Journal*, Vol. 68, No. 1 (Jan./Feb. 1989).

It is understood that, while the material system InGaAsP/InP is described below for fabricating the tapered semiconductor waveguide device, other material combinations may be selected from other semiconductor Group III–V systems such as GaAs/AlGaAs, GaAs/AlAs, InGaAs/InAlAs, InGaAs/InGaAlAs, and GaAsSb/GaAlAsSb. In these semiconductor systems, the layers may be lattice-matched to suitable GaAs or InP substrates. Mismatching is also contemplated wherein strained layers are grown over the substrate material. Finally, extension of the device structures is also contemplated to semiconductor compounds in Group II–VI.

Since the practice of the present invention involves the formation of a staircase-like profile through a series of layers, it is necessary to have a starting workpiece including the necessary series of layers. An exemplary series of layers having the desirably necessary attributes comprises a plurality of guiding layers and a corresponding plurality of stop-etch layers interleaved with the plurality of guiding layers as shown in FIG. 1. Standard epitaxial growth techniques commonly known to those persons of ordinary skill in the art were employed to form the semiconductor heterostructure in FIG. 1.

As shown in FIG. 1, a lower cladding layer 10 supports the guiding layer/stop-etch layer interleaved structure. Layer 10 comprises InP and, in some applications, may lie between the guiding layer/stop-etch layer interleaved structure and a substrate. In other applications, layer 10 may act also as the substrate for the waveguide.

Above layer 10 are grown the following layers in succession: guiding layer 11, stop-etch layer 12, guiding layer 13, stop-etch layer 14, guiding layer 15, stop-etch layer 16, guiding layer 17, stop-etch layer 18, guiding layer 19, stop-etch layer 20, and guiding layer 21. The guiding layers comprise semiconductor material having a higher index of refraction than the index of refraction for the material forming a cladding for the waveguide, whether semiconductor, air or otherwise. In the present example, quaternary material comprising $In_{1-y}Ga_yAs_xP_{1-x}$ employed for guiding layers, wherein the alloy composition ratios x and y are selected to produce a particular lattice constant and a particular wavelength or energy bandgap for the heterostructure. For a description of techniques for choosing x and y, see R. Moon et al., *J. Electron. Materials*, Vol. 3, p. 635 et seq. (1974). Thickness of individual guiding layers is taken into consideration when determining the shape of the tapered waveguide and the amount of spatial mode confinement desired at each end and along the length of the tapered waveguide.

The stop-etch layers comprise semiconductor material which have a substantially reduced etch rate for any etchant or etching technique which is utilized in the processing of the guiding layers. In this example, InP stop-etch layers have a lower etch rate in the material selective etchants which are used to remove exposed portions of InGaAsP guiding layers. By employing these techniques, it is possible to fabricate tapered waveguides in which each stop-etch layer may possibly have a thickness measured from heterointerface to heterointerface which is sufficiently small to avoid significantly perturbing characteristics of the optical signal guided by the guiding layers. However, the use of stop-etch layers which perturb characteristics of the optical signal is contemplated provided that the overall effect does not significantly impair operation of the tapered waveguide.

Figure 2:
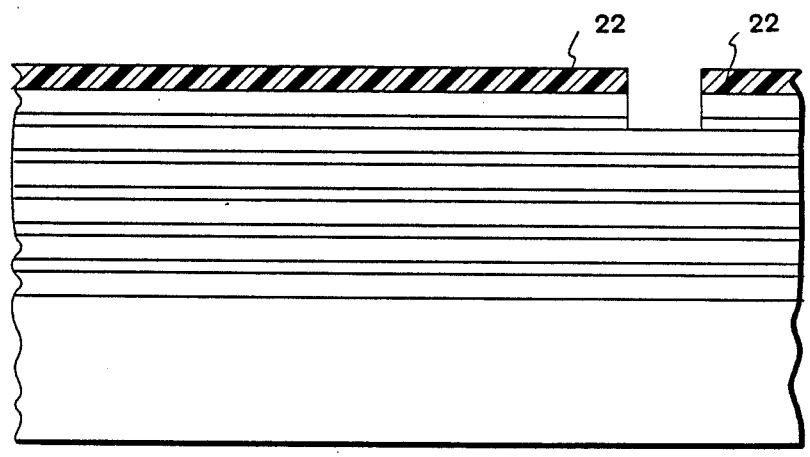

Realization of tapering occurs by sequential mask/etching which begins by covering the uppermost guiding layer shown as layer 21 with photolithographic mask 22 as shown in FIG. 2. Photoresist masks such as Shipley or AZ or the like are suitable for use as mask 22. Deposition techniques such as CVD or the like are also suitable for depositing the mask. When employing the latter technique, silicon nitride or silicon oxide layers are commonly used for masking. Mask 22 includes an opening to define an exposed area of layer 21.

After the mask is in place, a material selective etchant is placed in contact with guiding layer 21 to remove the portion thereof exposed by the mask. Several wet chemical etchants have been shown to be suitable for selectively removing quaternary semiconductor material such as exists in the heterostructure in FIG. 2. Examples of several selective etchants include: a solution of $H_2SO_4:H_2O_2:H_2O$ in ratios such as 3:1:1 and 10:1:1; or AB etchant wherein the A solution is approximately 40 ml. $H_2O$ + 0.3 g. $AgNO_3$ + 40 ml. HF and the B solution is approximately 40 g. $CrO_3$ + 40 ml. $H_2O$; or a solution of $KOH:K_3Fe(CN)_6:H_2O$. Etching time varies according to the thickness of the particular quaternary layer, temperature, and alloy composition ratios for the layer. Usually etching is halted by rinsing the etchant away with, for example, deionized water. Mask 22 may be removed at this point or after the removal of the exposed portion of stop-etch layer 20.

After the exposed portion of layer 21 is removed, the vertical edges of layer 21 are suitable for masking the exposed portion of stop-etch layer 20. Etchants such as HCl or $HCl:H_3PO_4$ (e.g., 2:1) are useful in etching InP stop-etch layers. In general, etchants such as HCl continue to react with InP until a particular crystallographic plane is exposed. As such, rinsing may or may not be required to halt the etching of layer 20.

Figure 3:
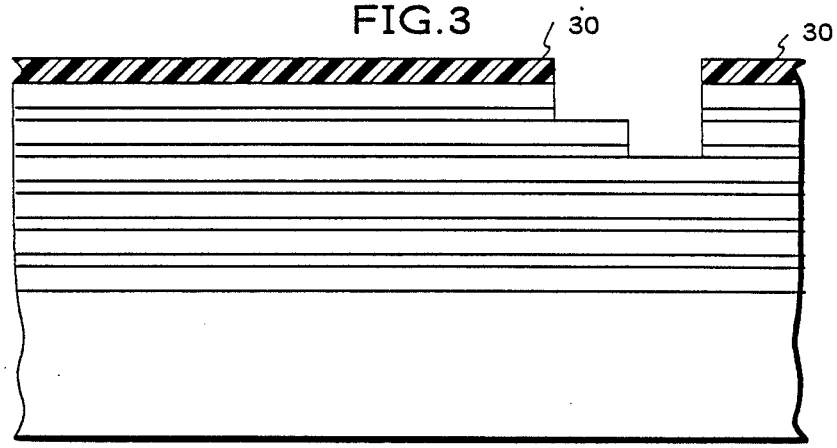

To continue the tapering process, it is necessary to form photolithographic mask 30 on layer 21 as shown in FIG. 3. Mask 30 is substantially aligned on one side with the end of the former opening for mask 22, now removed. The opening in mask 30 exposes a larger portion of layer 21 (extending to the left of the removed portion). As a result, portions of both guiding layers 21 and 19 are exposed for subsequent etching. The process described above is useful for developing a conceptual understanding of the tapering process. In actual wafer production, chips are flip-flopped so that a descending taper from one chip flows into an ascending taper for another chip. Then, a cleave would be made between the descending and ascending tapers. Also, it should be noted that the tapering process is performed generally before lateral processing occurs for defining waveguide vertical sidewalls and the like.

Material selective etchants are applied to the exposed portions of the guiding layers to expose the underlying stop-etch layer, layers 20 and 18. This etching step is substantially halted by the stop-etch layers. If necessary, the etching step may be completely halted by rinsing to remove the etchant. Other material selective etchants are then applied to now exposed portions of stop-etch layers 20 and 18 to remove those portions. An exemplary resulting structure from the sequential mask/etch procedure is shown in FIG. 3.

This procedure is carried on with additional mask/etch steps wherein each photolithographic mask defines an opening which is larger, by a predetermined amount, than the opening defined by the previous masks. For the initial structure shown in FIG. 1, the sequential mask/etch procedure results after five iterations with a staircase-like tapered profile as shown in FIG. 4.

Figure 4:
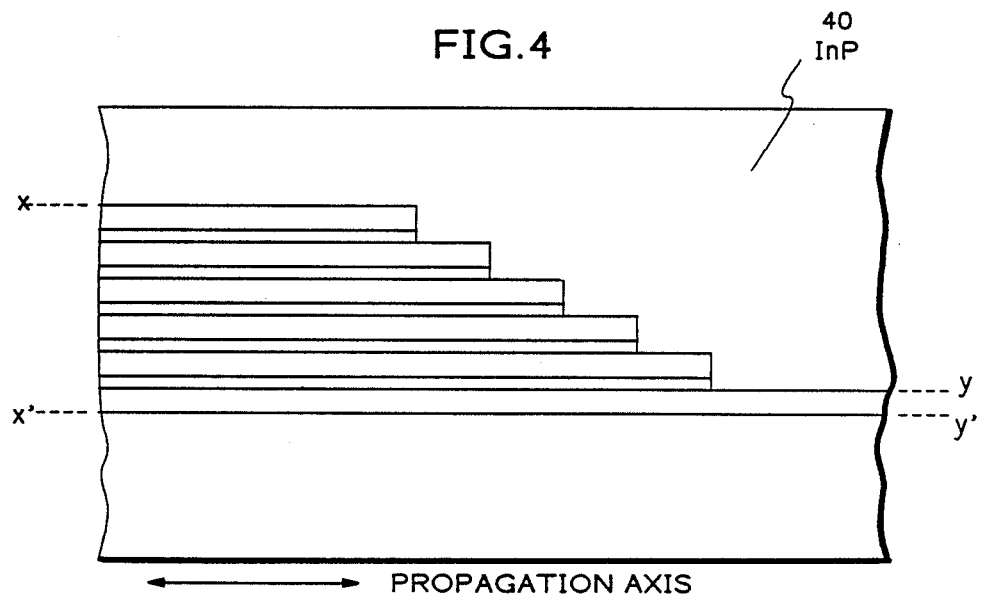

As shown in FIG. 4, an additional cladding layer 40 is epitaxially grown over the exposed tapered waveguide. Layer 40 is selected from materials having a lower refractive index than that of the tapered structure. While the cross-sectional view shows cladding for the guiding layers from above and below the heterostructure, it is contemplated that lateral or transverse cladding regions be formed around the tapered heterostructure.

Demarcations x—x' and y—y' denote the reference points at the outermost guiding layers at each end of the taper. The corresponding reference points are depicted in directions perpendicular to the propagation axis along which optical signals generally propagate.

Figure 6:
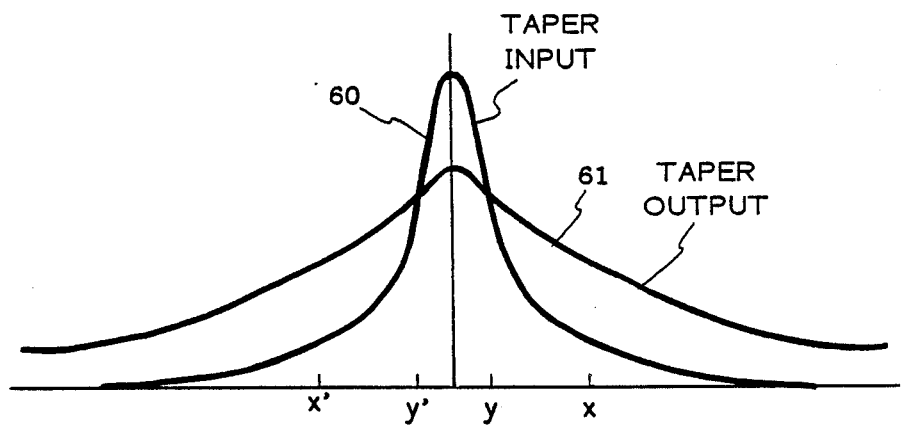
FIGS. 6 and 7 show exemplary lightwave signals input to and output from the tapered semiconductor waveguides shown in FIGS. 4 and 5, respectively.

These reference points are useful in comparing the spatial modes at various locations along the taper. As shown in FIG. 6, the optical signal having spatial mode 60 is input to the tapered waveguide and is confined substantially between the reference points x—x' of guiding layers 11 through 21. The central modes of the signals have been shifted to permit a better appreciation of the taper operation. Note that the signals have not been drawn to scale. When the optical signal traverses the tapered waveguide, the optical signal undergoes adiabatic beam expansion with increasing optical power coupling into the cladding region around the taper. Upon reaching the taper output, the optical signal has a mode as depicted by spatial mode 61 which is significantly larger than the beam at the taper input and a still guided by the guiding layer whose reference points are y—y' (e.g., layer 11). Accordingly, the spatial mode of the optical signal traversing the taper is forced to make an adiabatic transition from a tightly controlled mode such as output by a laser to a significantly larger mode which is excellent for fiber coupling, for example.

By expanding the mode size, it is possible to control and reduce the beam divergence for optical signals output by the tapered waveguide. This is possible because large fundamental spatial mode output from the tapered waveguide exhibits a substantially flat phase front. Beam divergence control has been observed from far field measurements taken on a waveguide device similar to the one described above wherein the tapered waveguide decreased from approximately 3000Å (x—x') to approximately 500Å (y—y') over a length exceeding 100μm measured along the propagation axis. Full half power angles for the far field radiation patterns were observed between 10° and 12° for both vertical and horizontal transverse axes.

In an exemplary embodiment and application, the tapered waveguide is employed inside a laser cavity having a multiple quantum well active layer structure along a portion of the resonator cavity length before the tapered waveguide. The multiple quantum well layer structure includes an active stack of wells having a photoluminescence wavelength $\lambda_p \approx 1.5$ μm. The multiple quantum well active stack comprises four quantum wells having a total thickness of approximately 800Å utilizing InGaAs and InGaAsP (1.3 μm) as the well and barrier materials, respectively. The active layer structure (not shown) is situated on top of the taper heterostructure of FIG. 1, and is separated from layer 21 by an InP stop-etch layer (also, not shown) having a thickness of approximately 200Å. The active layer structure and the stop-etch layer immediately thereunder are removed to leave a passive transparent waveguide heterostructure along a predetermined portion of the laser cavity, which is then transformed into the tapered waveguide in accordance with the principles described herein. Stop-etch layer 20 and the remaining stop-etch layers were approximately 200Å thick. Guiding layer 21 through 11 comprises InGaAsP (1.3 μm). Guiding layer 21 having a thickness of approximately 1025Å is extended beyond the etched end of the active layer stack and its underlying stop-etch layer (both not shown) by approximately 20 μm. Guiding layer 19 having a thickness of approximately 700Å is extended beyond the etched end of layers 21 and 20 by approximately 20 μm. Guiding layer 17 having a thickness of approximately 425Å is extended beyond the etched end of layers 19 and 18 by approximately 25 μm. Guiding layer 15 having a thickness of approximately 300Å is extended beyond the etched end of layers 17 and 16 by approximately 30 μm. Guiding layer 13 having a thickness of approximately 250Å is extended beyond the etched end of layers 15 and 14 by approximately 40 μm. Guiding layer 11 having a thickness of approximately 500Å is extended beyond the etched end of layers 13 and 12 as the output guiding layer of the tapered waveguide device. While the tapered waveguide described above has a somewhat nonlinear tapered profile, linear, quadratic, logarithmic, exponential or any other desirable profiles are contemplated and achievable by properly varying the length, or the thickness, or the length and thickness of the various guiding layers included in the tapered structure. It should be clear to those skilled in the art that the extension of one guiding layer past the etched end of the prior layer is preferably selected to be longer than several optical wavelengths to insure proper adiabatic changes in the waveguide mode profile. Typically, these extensions are on the order of several microns.

Additional beam control or beam shaping is afforded by including one or more guiding layers in the cladding region around the tapered structure. Such additional guiding layers tend to contain the optical power to the vicinity of the tapered structure, and can lead to more desirable beam profiles. Asymmetric and symmetric displacements of the additional guiding layers are contemplated for beam control and shaping.

Figure 5:
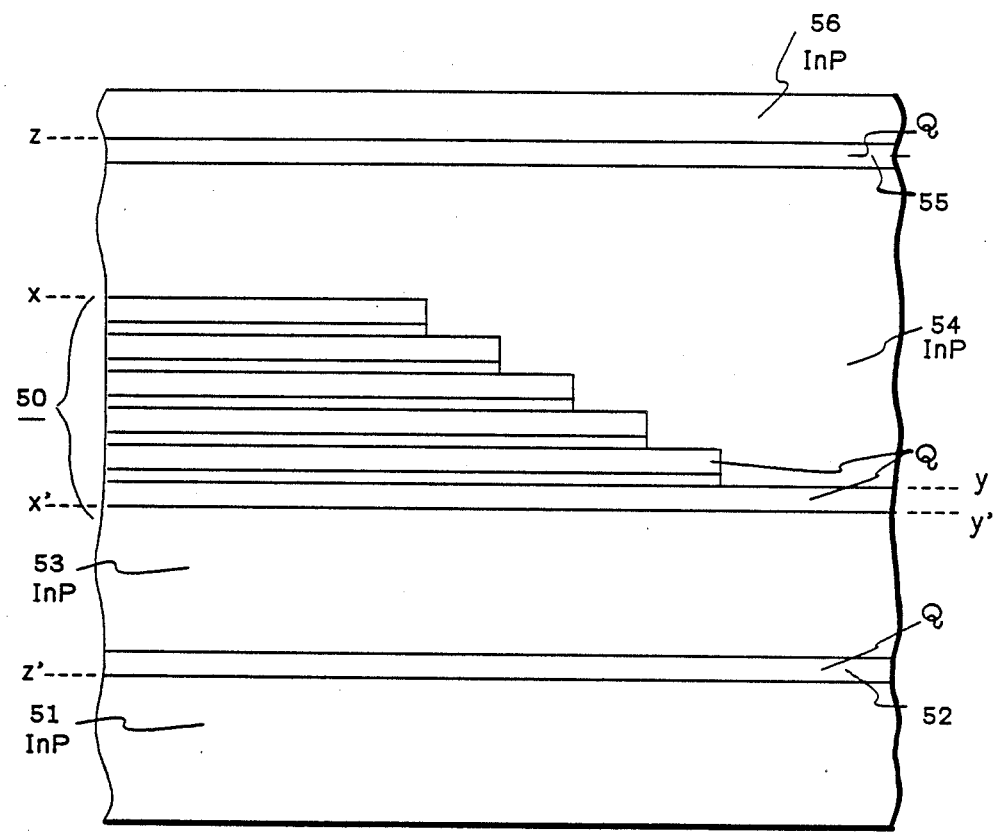
FIG. 5 is a cross-sectional view of an exemplary tapered semiconductor waveguide including beam shaping elements.

One exemplary embodiment of a beam control and shaping element combined with the tapered waveguide is shown in FIG. 5. Tapered waveguide structure 50 comprising interleaved guiding and stop-etch layers is surrounded by a lower refractive index cladding region including cladding layers 51, 53, 54 and 56. Within the cladding region are disposed higher refractive index guiding layers 52 and 55 for controlling the shape of the spatial mode for the optical signal output from the tapered waveguide.

Figure 7:
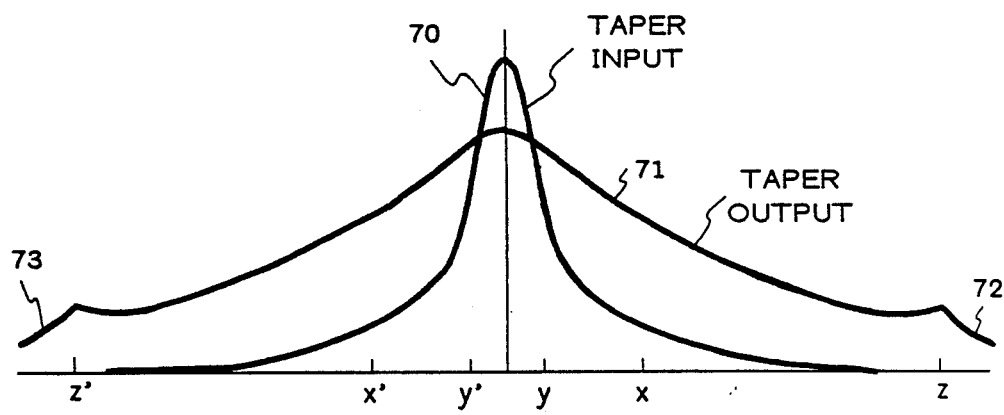

FIG. 7 shows the effects of beam control and shaping in accordance with the structure from FIG. 5. The central modes of the signals have been shifted to permit a better appreciation of the taper operation. Note that the signals have not been drawn to scale but should suffice for this analysis. In this example, additional optical signal power has been guided to the taper output by the inclusion of beam shaping via guiding layers 52 and 55 in the cladding region. In comparison to taper output signal 61, taper output signal 71 includes more output power between reference points z—z' and has some additional shaping in the mode at z' (location 73) and z (location 72) as shown.

Several benefits obtain from utilizing the tapered waveguide structure described above. The processing is standard and longitudinal in nature. Moreover, it is compatible with present technology employed in fabricating III-V lasers and photonic integrated circuits. As a result, the waveguide is integrable with photonic devices and exhibits high reproducibility. Critical alignment has been substantially reduced by the large taper optical output, so that the tapered waveguide device will permit greater packaging tolerances. The taper design is usually established to achieve equal loss at each step interface from guiding layer to adjacent guiding layer.

We claim:

1. A method for etching a multilayer semiconductor heterostructure body to form a waveguide device, said multilayer semiconductor heterostructure body including guiding layers and stop-etch layers interleaved with each other, the method comprising the steps of:

contacting a surface of a predetermined exposed guiding layer portion with a first material selective chemical etchant for a time period sufficient to expose a corresponding predetermined stop-etch layer portion;

contacting a surface of a predetermined exposed stop-etch layer portion with a second material selective chemical etchant for a time period sufficient to expose a corresponding predetermined guiding layer portion;

iterating in sequence the first contacting step followed by the second contacting step wherein the predetermined exposed layer portions during a given iteration are longer than and include at least the predetermined exposed layer portions for previous iterations so that a staircase-like tapered waveguide profile is formed.

2. The method defined in claim 1 wherein the multilayer semiconductor heterostructure body comprises semiconductor material consisting of compositions selected from Groups III and V and Groups II and VI.

3. The method defined in claim 2 wherein the guiding layers comprise InGaAsP and the stop-etch layers comprise InP, and wherein the first material selective etchant comprises $H_2SO_4:H_2O_2:H_2O$ and the second material selective etchant comprises HCl.

4. The method defined in claim 3 wherein the second material selective etchant comprises $HCl:H_3PO_4$.

5. The method defined in claim 1 wherein each guiding layer extends along a predetermined axis of said multilayer semiconductor heterostructure body sufficiently far for said guiding layers to exhibit a staircase-like profile selected from the group consisting of linear, parabolic and exponential profiles.

6. The method defined in claim 2 wherein the guiding layers comprise InGaAsP and the stop-etch layers comprise InP, and wherein the first material selective etchant comprises AB etchant solution and the second material selective etchant comprises HCl.

7. The method defined in claim 6 wherein the second material selective etchant comprises $HCl:H_3PO_4$.

8. The method defined in claim 2 wherein the guiding layers comprise InGaAsP and the stop-etch layers comprise InP, and wherein the first material selective etchant comprises $KOH:K_3Fe(CN)_6:H_2O$ and the second material selective etchant comprises HCl.

9. The method defined in claim 8 wherein the second material selective etchant comprises $HCl:H_3PO_4$.

* * * * *